United States Patent
Wu

(10) Patent No.: US 8,953,668 B2
(45) Date of Patent: Feb. 10, 2015

(54) METHOD AND CIRCUIT OF CLOCK AND DATA RECOVERY WITH BUILT IN JITTER TOLERANCE TEST

(75) Inventor: Pei-Si Wu, Kao Hsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 125 days.

(21) Appl. No.: 13/367,954

(22) Filed: Feb. 7, 2012

(65) Prior Publication Data

US 2012/0213265 A1    Aug. 23, 2012

(30) Foreign Application Priority Data

Feb. 18, 2011    (TW) .............................. 100105396 A

(51) Int. Cl.
| | |
|---|---|
| *H04B 3/46* | (2006.01) |
| *H04B 17/00* | (2006.01) |
| *H04Q 1/20* | (2006.01) |
| *H03L 7/081* | (2006.01) |
| *H04L 1/20* | (2006.01) |
| *H03L 7/08* | (2006.01) |
| *H03L 7/093* | (2006.01) |

(52) U.S. Cl.
    CPC .............. *H04L 1/205* (2013.01); *H03L 7/0814* (2013.01); *H03L 7/0807* (2013.01); *H03L 7/093* (2013.01)
    USPC ............................. 375/226; 375/355; 375/376

(58) Field of Classification Search
    CPC ...... H03L 7/0807; H03L 7/0814; H03L 7/093
    USPC .......... 375/224, 226, 227, 228, 354, 355, 376
    See application file for complete search history.

(56) References Cited

U.S. PATENT DOCUMENTS

| | | | |
|---|---|---|---|
| 5,793,822 A | 8/1998 | Anderson et al. | |
| 5,835,501 A | 11/1998 | Dalmia et al. | |
| 6,397,042 B1 | 5/2002 | Prentice et al. | |
| 6,625,560 B1 | 9/2003 | Molla et al. | |
| 6,834,367 B2 | 12/2004 | Bonneau et al. | |
| 7,135,904 B1 | 11/2006 | Moshe et al. | |
| 7,363,563 B1 | 4/2008 | Hissen et al. | |
| 7,394,277 B2 | 7/2008 | Ishida et al. | |
| 7,558,991 B2* | 7/2009 | Mattes et al. | 714/700 |
| 7,681,091 B2 | 3/2010 | Hafed | |
| 7,733,139 B2 | 6/2010 | Huang | |
| 8,401,137 B2* | 3/2013 | Miles | 375/355 |
| 8,504,882 B2* | 8/2013 | Li et al. | 714/704 |
| 2007/0057830 A1* | 3/2007 | Wiesbauer et al. | 341/126 |
| 2007/0104260 A1* | 5/2007 | Ichiyama et al. | 375/224 |
| 2008/0013665 A1 | 1/2008 | Werker et al. | |
| 2010/0066577 A1 | 3/2010 | Huang | |
| 2010/0097071 A1* | 4/2010 | Lee et al. | 324/537 |

(Continued)

FOREIGN PATENT DOCUMENTS

| | | |
|---|---|---|
| TW | 200741217 A | 11/2007 |
| TW | 200818713 A | 4/2008 |

(Continued)

*Primary Examiner* — Freshteh N Aghdam
(74) *Attorney, Agent, or Firm* — Muncy, Geissler, Olds & Lowe, P.C.

(57) ABSTRACT

A clock and data recovery circuit with built in jitter tolerance test is disclosed. Imposing jitter on a filter inside a CDR loop to cause phase disturbances to the clock and data recovery circuit, thereby to test the jitter tolerance of the clock and data recovery circuit. Accordingly, IC test cost is significantly reduced by increasing few circuit sizes.

9 Claims, 8 Drawing Sheets

(56) References Cited

U.S. PATENT DOCUMENTS

2010/0231233 A1* 9/2010 Dasnurkar .................... 324/613
2013/0093433 A1* 4/2013 Lee et al. ..................... 324/614

FOREIGN PATENT DOCUMENTS

| TW | 200821589 A | 5/2008 |
| TW | 200934129 A | 8/2009 |

* cited by examiner

METHOD AND CIRCUIT OF CLOCK AND DATA RECOVERY WITH BUILT IN JITTER TOLERANCE TEST

This application claims the benefit of the filing date of Taiwan Application Ser. No. 100105396, filed on Feb. 18, 2011, the content of which is incorporated herein by reference in its entirety.

BACKGROUND OF THE INVENTION

1. Field of the Invention

The invention relates to a clock and data recovery circuit (hereafter called CDR), and more particularly to a CDR with built in jitter tolerance test.

2. Description of the Related Art

FIG. 1 is a block diagram of testing of a CDR by means of a tester. Referring to FIG. 1, in jitter tolerance testing, a jitter source 104 and a pattern generator 106 are used to generate a data stream Dj containing jitter and an original data stream $D_C$ to be sent to a CDR 102 and a bit error rate (BER) tester 108. The CDR 102 receives the data stream Dj containing jitter and performs clock and data recovery operations to generate a recovery data stream $D_R$ and a recovery clock signal $C_R$. Finally, a bit error rate tester 108 compares recovery data stream $D_R$ with the original data stream $D_C$ to display a bit error rate BER if there is a bit missing or an error occurs. Throughout the specification and claims, the following terms take the meanings explicitly associated herein, unless the context clearly dictates otherwise. The term "bit error rate" refers to the number of bit errors (received by a receiver) divided by the total number of transferred bits. The term "jitter" refers to a deviation of a signal edge from where it should be.

In view of the conventional method that needs an expensive instrument to generate the data stream Dj containing jitter, several jitter measures are then proposed. For example, in a case where a transmit output and a receive input built in the same integrated circuit are connected to each other, providing a data stream containing jitter at the transmit output is used to test the characteristics of a receiver. However, several conventional methods impose jitter on a data stream by increasing additional circuits, thereby resulting in a larger circuit size. In addition, since circuits that impose jitter are generally implemented by analog circuits and the analog circuits vary according to voltages, temperatures and manufacturing processes, the imposed jitter amplitude cannot be estimated accurately.

SUMMARY OF THE INVENTION

One objective of the invention is to provide a clock and data recovery circuit with built in jitter tolerance test that can solve the above problems in the prior art.

One embodiment of the invention provides a clock and data recovery circuit. The clock and data recovery circuit comprises: a sampler for sampling an input data according to a recovery clock to generate an edge value and a sampling value; a phase detector for performing phase detection according to the edge value and the sampling value to generate a detection value; a filter for generating a control word according to the detection value; and, a phase digital-to-analog converter for adjusting a phase of a reference clock according to the control word to generate the recovered clock with a corresponding phase; wherein the control word does not contain jitter when the filter operates in a normal mode and the control word contains jitter when the filter operates in a measure mode.

One embodiment of the invention provides a clock and data recovery circuit. The clock and data recovery circuit comprises: a sampler for sampling an input data according to a recovery clock to generate a sampling value; a phase detector for detecting a phase difference between the recovery clock and the input data to generate a first voltage signal and a second voltage signal; a charge pump for converting the first voltage signal and the second voltage signal into a phase-difference current signal; a jitter source for generating a jittered current signal according to a control signal while operating in the measure mode, the jitter source being disabled while operating in the normal mode; a low-pass filter for performing low-pass filtering on the phase-difference current signal and the jittered current signal to generate a third voltage signal; and, a voltage controlled oscillator for generating the recovery clock according to the third voltage signal.

One embodiment of the invention provides a clock and data recovery method. The clock and data recovery method comprises: sampling an input data according to a recovery clock to obtain an edge value and a sampling value; performing phase detection according to the edge value and the sampling value to obtain a detection value; obtaining a control word according to the detection value; and, adjusting a phase of a reference clock according to the control word to generate the recovered clock with a corresponding phase; wherein the control word does not contain jitter when the clock and data recovery method operates in a normal mode and the control word contains jitter when the clock and data recovery method operates in a measure mode.

One embodiment of the invention provides a clock and data recovery method. The clock and data recovery method comprises: sampling an input data according to a recovery clock to obtain a sampling value; detecting a phase difference between the recovery clock and the input data to obtain a first voltage signal and a second voltage signal; converting the first voltage signal and the second voltage signal into a phase-difference current signal; obtaining a jittered current signal according to a control signal when the clock and data recovery method operates in a measure mode; performing low-pass filtering on the phase-difference current signal and the jittered current signal when the clock and data recovery method operates in the measure mode, otherwise performing low-pass filtering on the phase-difference current signal and converting the phase-difference current signal into a third voltage signal when the clock and data recovery method operates in a normal mode; and, obtaining the recovery clock according to the third voltage signal.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Unlike the prior arts that perform jitter test external to a CDR loop, the invention imposes jitter inside the CDR loop to achieve a built-in jitter test. Generally, CDRs are divided into digital oversampling CDRs and analog PLL-based CDRs. According to the invention, phase disturbances are applied to the digital oversampling CDRs and current disturbances are applied to the analog PLL-based CDRs, thereby to test a jitter tolerance of CDRs.

Figure 1:
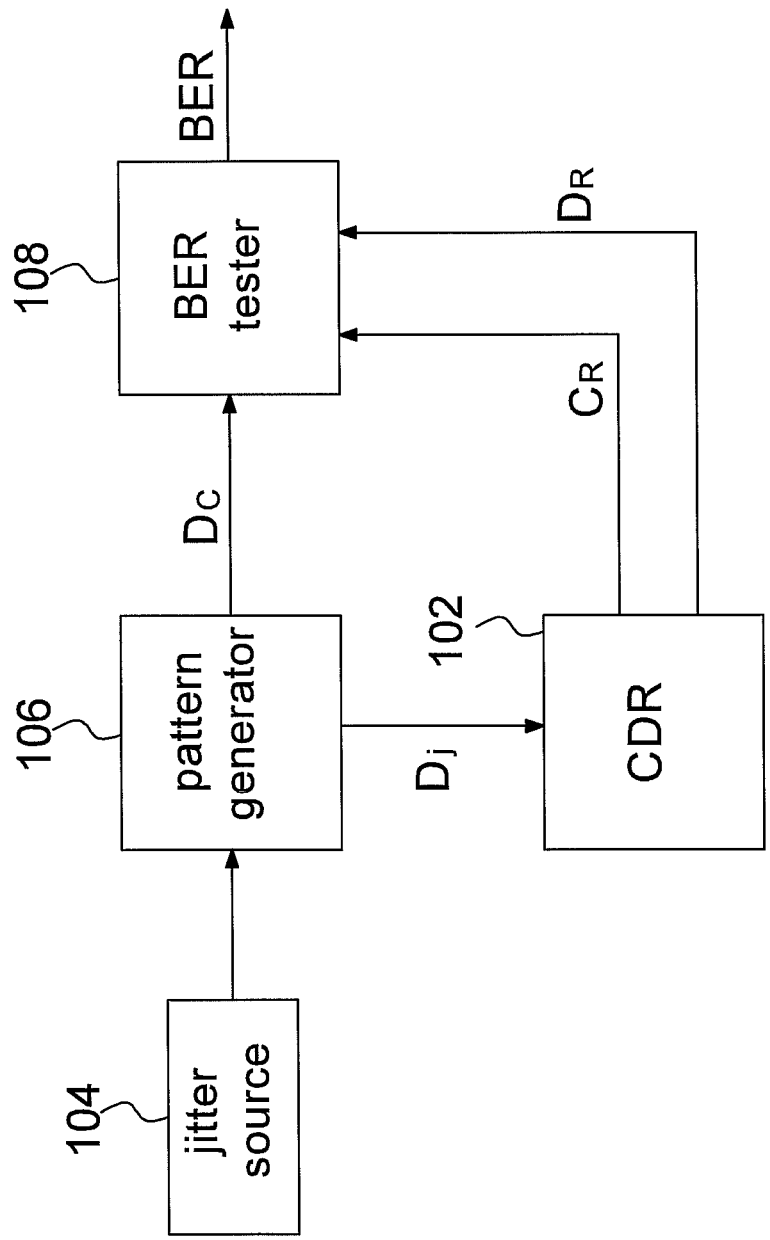
FIG. 1 is a block diagram of testing of a CDR by means of a tester.
Figure 2:
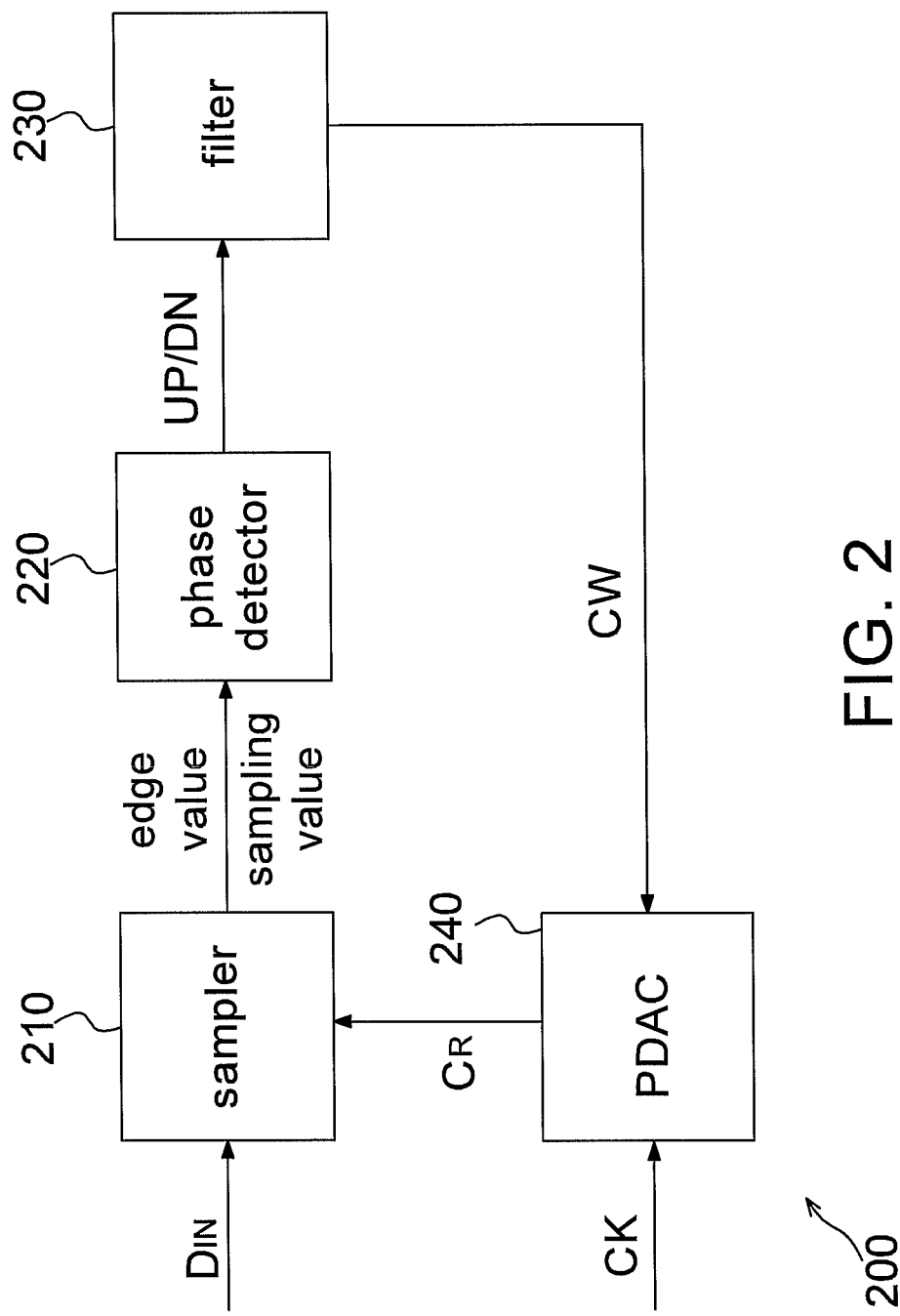
FIG. 2 is a block diagram of a CDR with built in jitter tolerance test according to an embodiment of the invention.

FIG. 2 is a block diagram of a CDR with built in jitter tolerance test according to an embodiment of the invention. Referring to FIG. 2, the CDR 200 with built in jitter tolerance test of the invention, applied in a receiver, includes a sampler 210, a phase detector 220, a filter 230 and a phase digital-to-analog converter (PDAC) 240. According to one embodiment, the phase detector 220 is implemented by a bang-bang phase detector.

After receiving an input data stream $D_{IN}$, the sampler 210 samples each input data according to a recovery clock $C_R$ to generate an edge value and a sampling value. The phase detector 220 receives the edge values and the sampling values, performs phase detection and then generates a two-bit detection value UP/DN. Here, the two-bit detection value UP/DN indicates clock leads data or clock lags data. For example, when the detection value UP/DN is (+1), it indicates clock leads data; when the detection value UP/DN is (−1), it indicates clock lags data; when the detection value UP/DN is 0, it indicates there is no data transition.

Next, according to the detection value UP/DN, the filter 230 generates a control word CW to be sent to the PDAC 240 for selecting an output phase of a reference clock CK. Here, the control word CW does not contain jitter when the filter 230 operates in a normal mode. Contrarily, the control word CW contains jitter when the filter 230 operates in a measure mode. According to the control word CW, the PDAC 240 adjusts the phase of reference clock CK or selects the output phase of a reference clock CK to generate the recovery clock $C_R$ with a corresponding phase. In an alternative embodiment, the PDAC 240 can be replaced with a phase rotator or a phase interpolator. In this embodiment, if there are 32 phase steps per unit interval (UI), the bit width of the control word CW is 5-bit.

With regard to the digital CDR 200, a jitter source 340 installed at different positions (as shown in FIGS. 3A-3D) of the interior of the filter 230 imposes different jitter to cause phase disturbances to the CDR 200, thereby to test the jitter tolerance of the CDR 200.

Figure 3A:
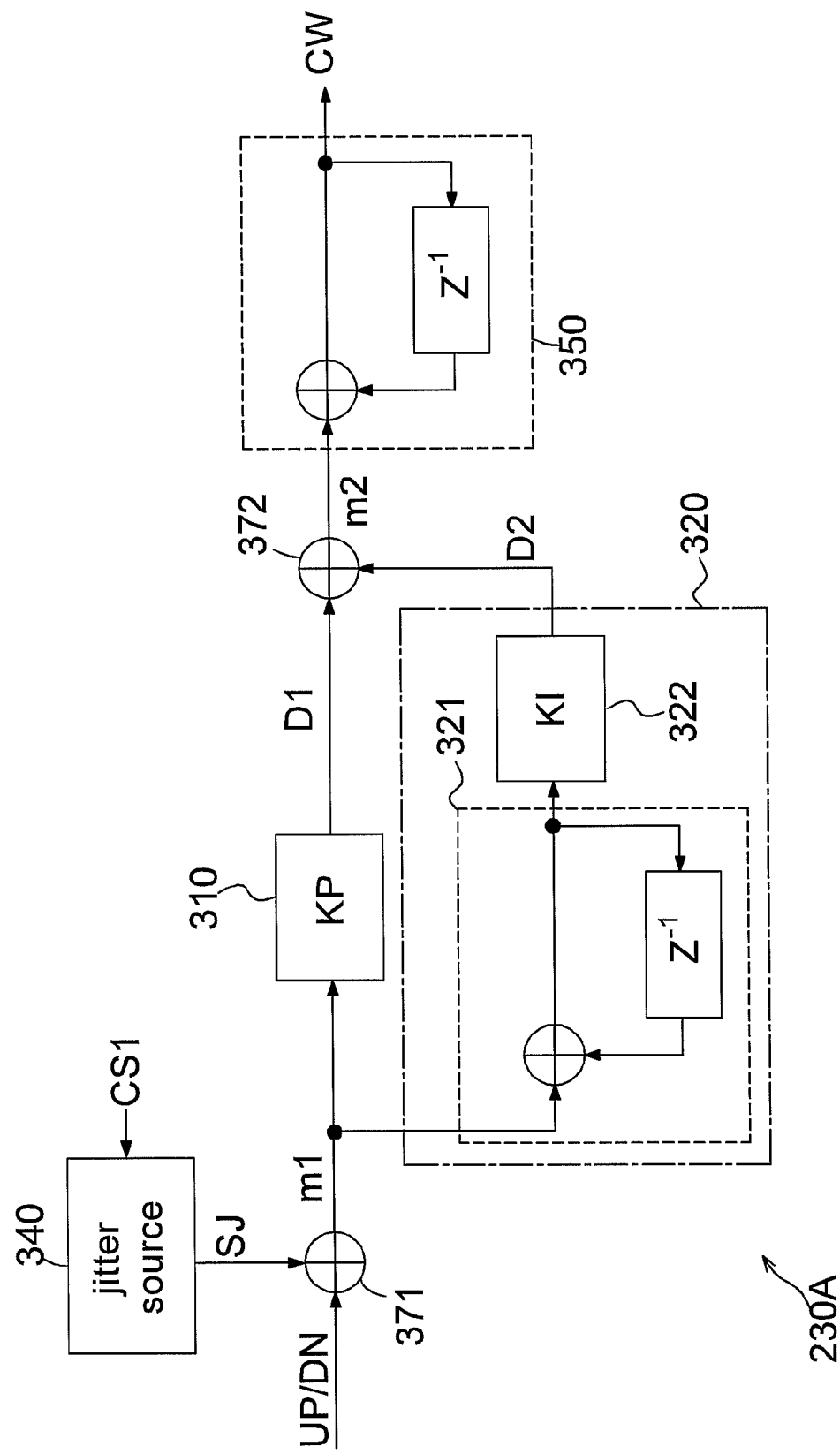
FIG. 3A shows a block diagram of a filter of a first embodiment of the invention according to FIG. 2.

FIG. 3A shows a block diagram of a filter of a first embodiment of the invention according to FIG. 2. Referring now to FIGS. 2 and 3A, a filter 230A of the invention includes a proportional unit 310, an integral unit 320, a jitter source 340, an integrator 350 and two adders 371, 372. The filters 230A-D, basically a PI-controller structure, is composed of the proportional unit 310 and the integral unit 320 to retain stability of the CDR 200 by setting two parameters KP and KI. According to an embodiment of the invention, the proportional unit 310 is implemented by a multiplier.

While operating in the measure mode, the jitter source 340 generates a jittered voltage signal SJ with a specified frequency and a specified amplitude according to a control signal CS1. While operating in the normal mode, the jitter source 340 is disabled (the jittered voltage signal SJ=0). The jittered voltage signal SJ is one of a square wave, a triangular wave and a sinusoidal wave.

The adder 371 adds the detection value UP/DN and the jittered voltage signal SJ to generate a sum value m1. The proportional unit 310 multiplies the sum value m1 by a proportional constant KP to generate a proportional value D1. The integral unit 320 includes an integrator 321 and a multiplier 322. The integrator 321 integrates the added value m1 and then the multiplier 322 multiplies the output of the integrator 321 by an integral constant KI to generate an integration value D2. The adder 372 adds the proportional value D1 and the integration value D2 to generate a sum value m2. The integrator 350 integrates the sum value m2 to generate the control word CW.

The frequency and the amplitude of the jittered voltage signal SJ are adjusted to test the effect on the CDR 200. Ideally, when a sampling clock and input data do not contain jitter, a sampling point (aligned to a clock edge) should be located at the center of the data bit, i.e., in the position of 0.5 UI. However, when the sampling clock and the input data contain jitter (the jitter source 340 is enabled) and the CDR 200 is capable of fully tracking the variations of data phases, the imposed jitter will not cause bit errors. On the contrary, if the jittered voltage signal SJ has an overly high frequency or an overly large amplitude, the CDR 200 will be not capable of calibrating the clock phase in real time. In this case, the data sampling point (aligned to a clock edge) is not in the position of 0.5 UI, but in close proximity to a data edge, thereby increasing the bit error rate.

Figure 3B:
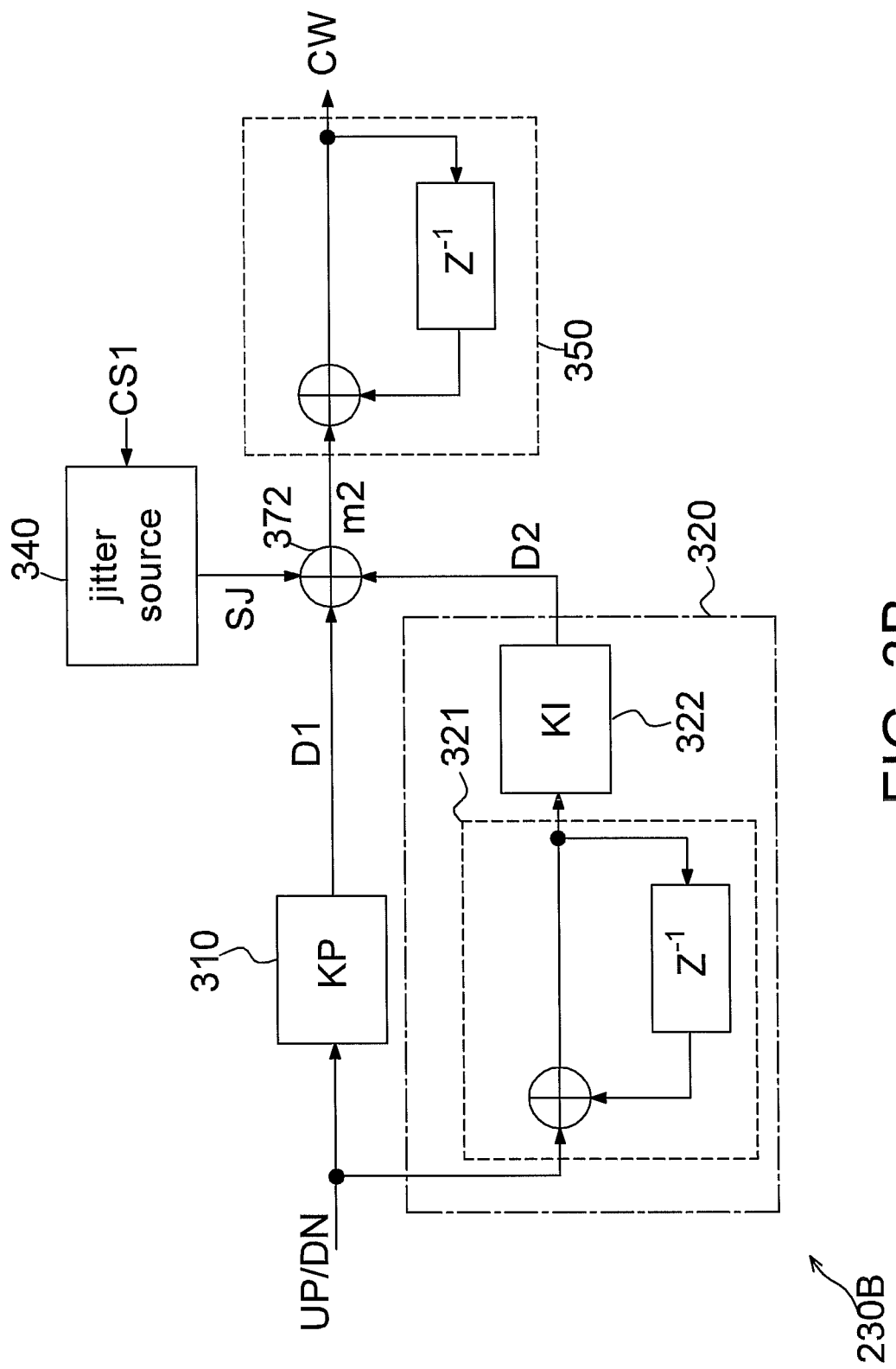
FIG. 3B shows a block diagram of a filter of a second embodiment of the invention according to FIG. 2.

FIG. 3B shows a block diagram of a filter of a second embodiment of the invention according to FIG. 2. The first and the second embodiments operate in the similar manner and the difference is as follows. The jitter source 340 is positioned at the input terminals of the proportional unit 310 and the integral unit 320 in the first embodiment. In other words, jitter is imposed at the input terminals of the proportional unit 310 and the integral unit 320. The jitter source 340 is positioned at the output terminals of the proportional unit 310 and the integral unit 320 in the second embodiment. Specifically, jitter is imposed at the adder 372. It is noted that in this embodiment, the integral unit 320 is always enabled no matter what mode the filter 230 is in (measure mode or normal mode).

Figure 3C:
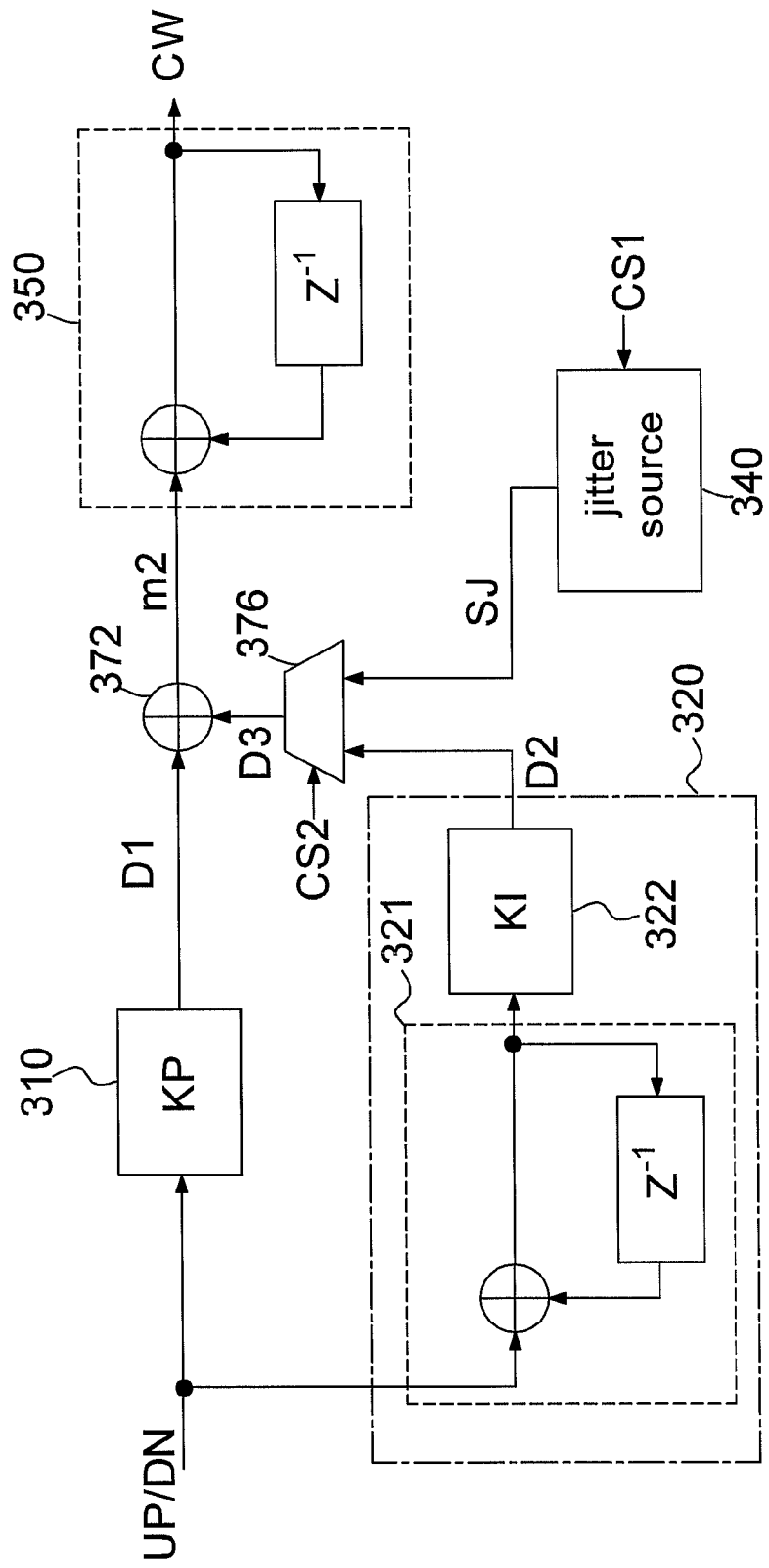
FIG. 3C shows a block diagram of a filter of a third embodiment of the invention according to FIG. 2.

FIG. 3C shows a block diagram of a filter of a third embodiment of the invention according to FIG. 2. In the third embodiment, modification is found in the addition of a multiplexer 376. In the measure mode, the integral unit 320 is disabled and the jitter source 340 generates a jittered voltage signal SJ with a specified frequency and a specified amplitude according to a control signal CS1. Meanwhile, the multiplexer 376 selects the jittered voltage signal SJ as the output signal D3 according to a control signal CS2. In the normal mode, the integral unit 320 is enabled and the jitter source 340 is disabled. Meanwhile, the multiplexer 376 selects the integration value D2 as the output signal D3 according to the control signal CS2.

Figure 3D:
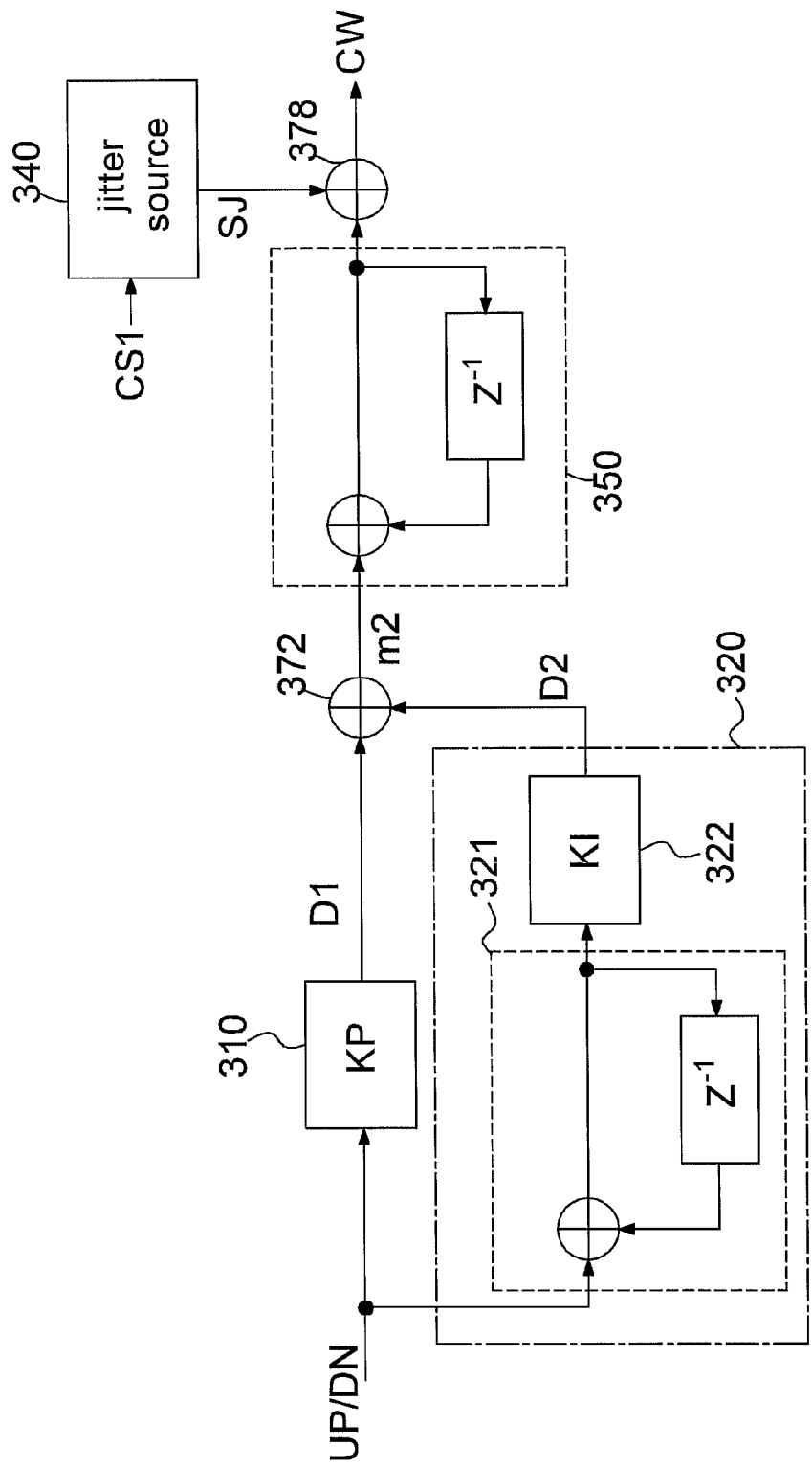
FIG. 3D shows a block diagram of a filter of a fourth embodiment of the invention according to FIG. 2.

FIG. 3D shows a block diagram of a filter of a fourth embodiment of the invention according to FIG. 2. The fourth and the above three embodiments operate in the similar manner. The difference is that the jitter source 340 is positioned at the output terminal of the integrator 350 in the fourth embodiment. Specifically, by means of an adder 378, jitter is imposed at the output terminal of the integrator 350 in the fourth embodiment.

Since each of the filters 230A-D is synthesized through digital automatic placement and routing process, the circuit size is increased by a small amount and accordingly IC test cost is reduced significantly. Further, since the jitter imposed by the jittered voltage signal SJ can be estimated by formulas, the jitter amplitude can be estimated accurately.

The above embodiments are realized by digital circuits. The following embodiments are realized by analog circuits.

Figure 4A:
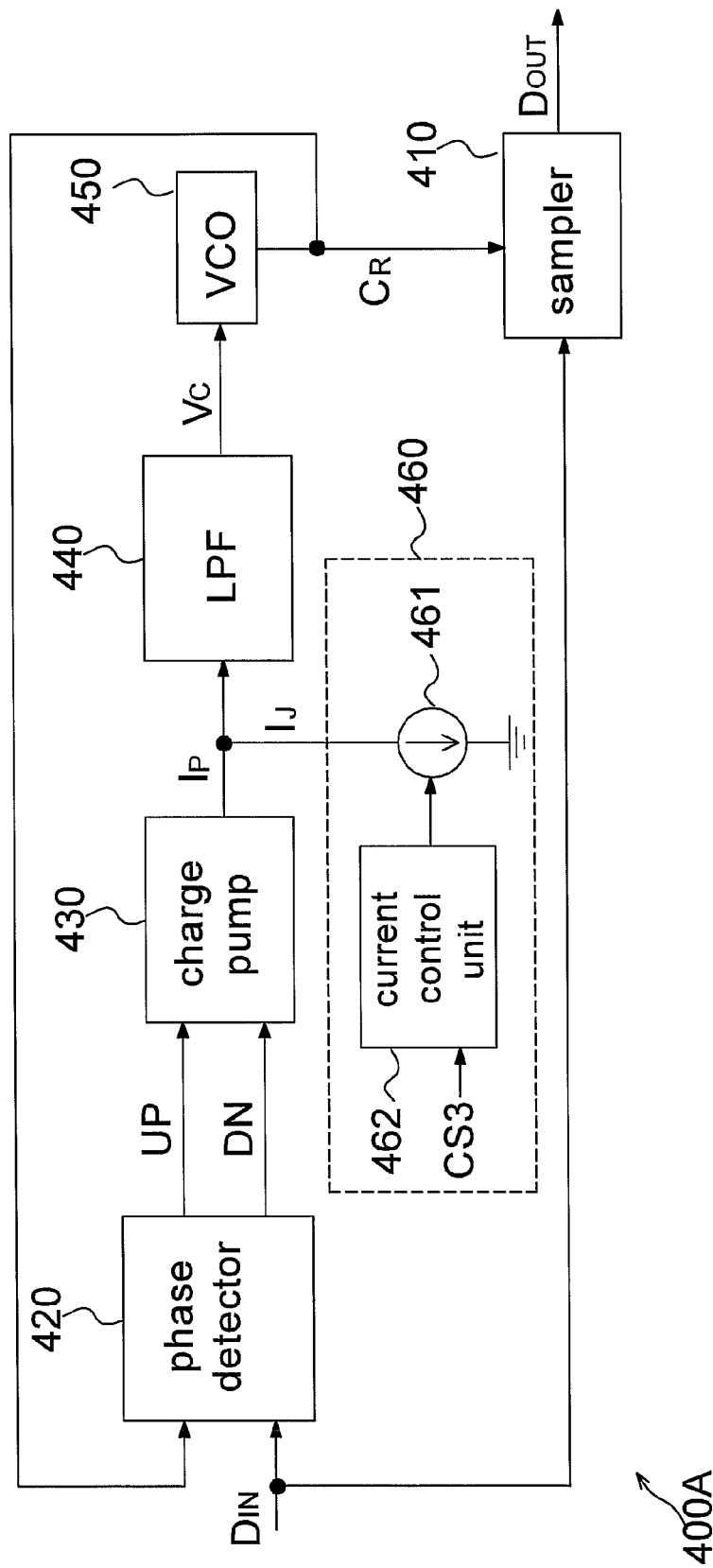
FIG. 4A shows a block diagram of a CDR with built in jitter tolerance test according to another embodiment of the invention.

FIG. 4A shows a block diagram of a CDR with built in jitter tolerance test according to another embodiment of the invention. Referring to FIG. 4A, the CDR 400A with built in jitter tolerance test of the invention, applied in a receiver, includes a sampler 410, a phase detector 420, a charge pump 430, a low-pass filter (LPF) 440, a voltage controlled oscillator (VCO) 450 and a jitter source 450.

According to a recovery clock $C_R$, the sampler 410 samples an input data $D_{IN}$ to generate a sampling value $D_{OUT}$. The phase detector 420 detects the phase difference between the recovery clock $C_R$ and the input data $D_{IN}$ and supplies two signals UP, DN, corresponding to the phase difference, to the charge pump 430. The charge pump 430 converts the two signals UP, DN into a current signal $I_P$. By means of controlling two signals UP, DN, the charge pump 430 injects the charge into or out of a resistor and a capacitor (not shown) in the low-pass filter 440.

While operating in the measure mode, the jitter source 460 generates a jittered current signal $I_J$ according to a control signal CS3. While operating in the normal mode, the jitter source 460 is disabled (the jittered current signal $I_J$=0). The control signal CS3 is used to control the amplitude and the frequency of the jittered current signal $I_J$.

The low-pass filter 440 converts the two current signals $I_P$ and $I_J$ into a voltage signal $V_C$ for supplying a stable DC voltage input to the VCO 450. The VCO 450 controls the output frequency of the recovery clock $C_R$ according to the voltage signal $V_C$. Since the integral of frequency is phase, the VCO 450 indirectly changes the phase of the recovery clock $C_R$ by adjusting the output frequency of the recovery clock $C_R$. The recovery clock $C_R$ is fed back to the phase detector 420 and then compared with the input data $D_{IN}$. As such, the operations go on until the data phase is locked. It means that the speed of the input data $D_{IN}$ is substantially equivalent to the frequency of the recovery clock $C_R$.

Figure 4B:
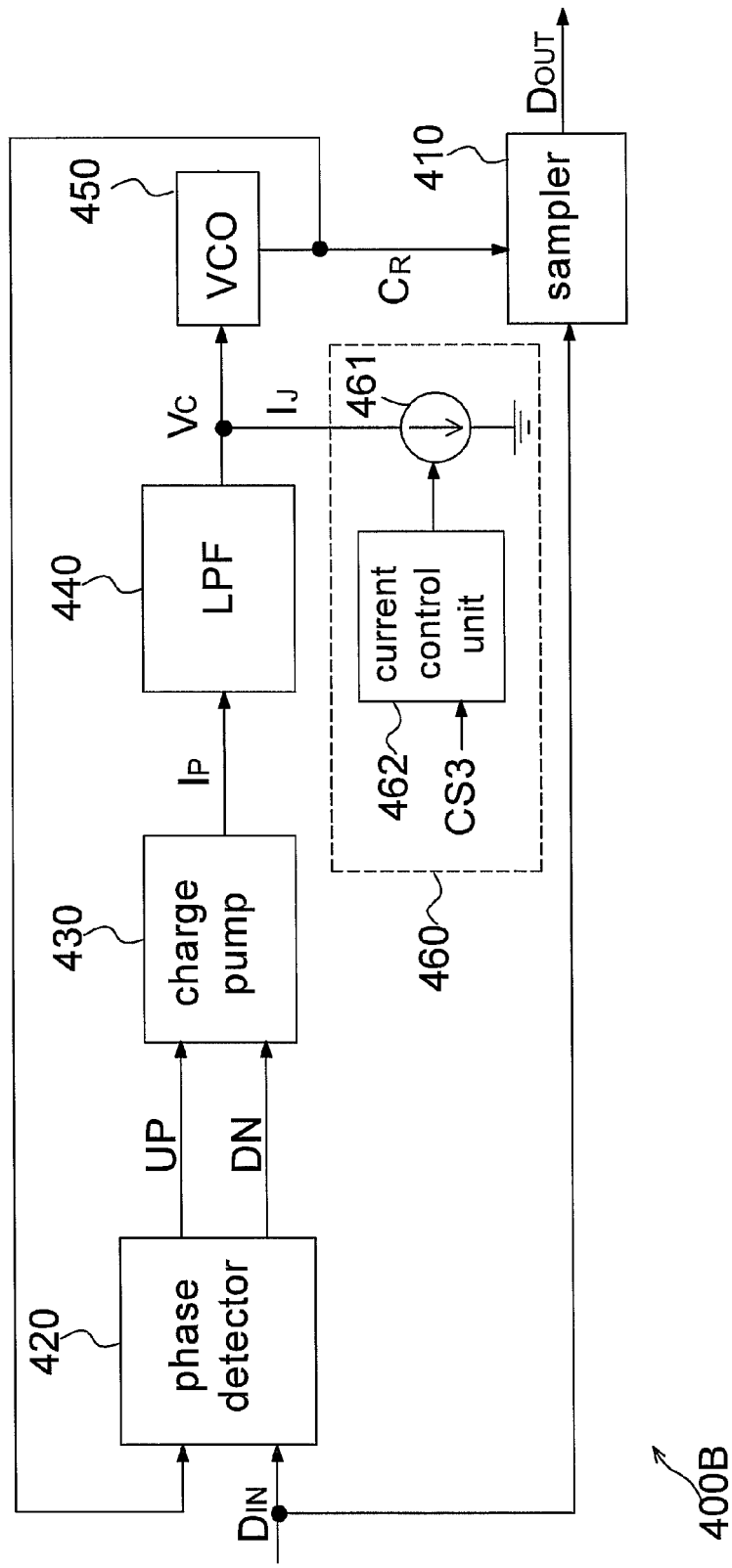
FIG. 4B shows a block diagram of a CDR with built in jitter tolerance test according to another embodiment of the invention.

A jitter source 460 installed at different positions (as shown in FIGS. 4A-4B) of the interior of the analog CDR is used to impose jitter to cause different current disturbances to the analog CDR 400A and 400B, therefore to test the jitter tolerance of the analog CDR 400A and 400B. Further, since the jitter imposed by the jittered current signal $I_J$ can be estimated by formulas, the amount of jitter amplitude can be estimated accurately.

FIG. 4B shows a block diagram of a CDR with built in jitter tolerance test according to another embodiment of the invention. The embodiments of FIGS. 4A and 4B operate in the similar manner and the difference is that the jitter source 460 may be positioned at the input terminal or the output terminal of the low-pass filter 440. This is due to the fact that the low-pass filter 440 is composed of a resistor and a capacitor.

In sum, the structure and the testing method of the invention have the following advantages. The demand for testing equipment during mass-production is reduced (only low-end testing equipments are demanded). While a chip operates normally, the invention is used for internal testing, convenient to find problems.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A clock and data recovery circuit, comprising:
 a sampler for sampling an input data according to a recovery clock to generate an edge value and a sampling value;
 a phase detector for performing phase detection according to the edge value and the sampling value to generate a detection value;
 a filter for generating a control word according to the detection value; and
 a phase digital-to-analog converter for adjusting a phase of a reference clock according to the control word to generate the recovery clock with a corresponding phase;
 wherein the control word does not contain jitter when the filter operates in a normal mode and the control word contains jitter when the filter operates in a measure mode;
 wherein the filter comprises:
 a proportional unit for multiplying the detection value by a proportional constant to generate a proportional value;
 an integral unit for integrating the detection value and multiplying the integrated detection value by an integral constant to generate an integral value;
 a jitter source for generating a jittered voltage signal according to a control signal while operating in the measure mode, the litter source being disabled while operating in the normal mode;
 an adder for adding the proportional value and the integral value; and
 an integrator for integrating the output of the adder to generate the control word;
 wherein an output of the jitter source is added to an output of the phase detector using a second adder, and wherein an output of the second adder is inputted to the proportional unit and the integral unit, an input terminal of the proportional unit and an input terminal of the integral unit.

2. The circuit according to claim 1, wherein the jitter source adjusts an amplitude and a frequency of the jittered voltage signal according to the control signal.

3. The circuit according to claim 1, wherein the jittered voltage signal is one of a square wave, a triangular wave and a sinusoidal wave.

4. A clock and data recovery circuit, comprising:
- a sampler for sampling an input data according to a recovery clock to generate an edge value and a sampling value;
- a phase detector for performing phase detection according to the edge value and the sampling value to generate a detection value;
- a filter for generating a control word according to the detection value; and
- a phase digital-to-analog converter for adjusting a phase of a reference clock according to the control word to generate the recovery clock with a corresponding phase;
- wherein the control word does not contain jitter when the filter operates in a normal mode and the control word contains jitter when the filter operates in a measure mode;
- wherein the filter comprises:
- a proportional unit for multiplying the detection value by a proportional constant to generate a proportional value;
- an integral unit for integrating the detection value and multiplying the integrated detection value by an integral constant to generate an integral value;
- a jitter source for generating a jittered voltage signal according to a control signal;
- a multiplexer having two input terminals being coupled with an output terminal of the integral unit and an output terminal of the jitter source, wherein the multiplexer selects and outputs the jittered voltage signal while operating in the measure mode and the multiplexer selects and outputs the integral value while operating in the normal mode;
- an adder for adding the proportional value and an output of the multiplexer; and
- an integrator for integrating an output of the adder to generate the control word.

5. The circuit according to claim 4, wherein the wherein the jitter source adjusts an amplitude and a frequency of the jittered voltage signal according to the control signal.

6. The circuit according to claim 4, wherein the jittered voltage signal is one of a square wave, a triangular wave and a sinusoidal wave.

7. The circuit according to claim 4, wherein the phase digital-to-analog converter can be replaced with one of a phase rotator and a phase interpolator.

8. A clock and data recovery method, comprising:
- sampling an input data according to a recovery clock to obtain an edge value and a sampling value;
- performing phase detection according to the edge value and the sampling value to obtain a detection value;
- obtaining a control word according to the detection value; and
- adjusting a phase of a reference clock according to the control word to generate the recovery clock with a corresponding phase;
- wherein the control word does not contain jitter when the clock and data recovery method operates in a normal mode and the control word contains jitter when the clock and data recovery method operates in a measure mode;
- wherein the step of obtaining the control word comprises:
- multiplying the detection value by a proportional constant to obtain a proportional value;
- integrating the detection value and multiplying the integrated detection value by an integral constant to obtain an integral value;
- obtaining a jittered voltage signal according to a control signal by means of a jittered source;
- selecting the jitter voltage signal as an output signal while operating in the measure mode, otherwise selecting the integral value as the output signal while operating in the normal mode; and
- integrating a sum of the proportional value and the output signal to obtain the control word.

9. The method according to claim 8, wherein the jittered voltage signal is one of a square wave, a triangular wave and a sinusoidal wave.

* * * * *